(12) United States Patent
Wang et al.

(10) Patent No.: US 8,513,587 B2
(45) Date of Patent: Aug. 20, 2013

(54) IMAGE SENSOR WITH ANTI-REFLECTION LAYER AND METHOD OF MANUFACTURING THE SAME

(75) Inventors: Tzu-Jui Wang, Fengshan (TW); Hsiao-Hui Tseng, Tainan (TW); Wei-Cheng Hsu, Kaohsiung (TW); Dun-Nian Yaung, Taipei (TW); Jen-Cheng Liu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 395 days.

(21) Appl. No.: 13/012,067

(22) Filed: Jan. 24, 2011

(65) Prior Publication Data
US 2012/0187282 A1 Jul. 26, 2012

(51) Int. Cl.
*H01L 27/00* (2006.01)
*H01L 31/00* (2006.01)
*H01L 29/80* (2006.01)
*H01L 21/02* (2006.01)

(52) U.S. Cl.
USPC ............ 250/208.1; 250/214.1; 257/257; 257/437

(58) Field of Classification Search
USPC ............ 250/208.1, 214.1, 214 R, 559.27; 257/19–21, 55, 63, 65, 200, 437, 613–616, 257/639–640, 257, 431, 432, 446, 447, 461; 438/341, 363, 416, 724, 791
See application file for complete search history.

(56) References Cited

U.S. PATENT DOCUMENTS 6,076,932 A * 6/2000 Uchida et al. ............ 359/614
7,834,412 B2 11/2010 Ando
8,039,287 B2 * 10/2011 Mouli ........................ 438/59

FOREIGN PATENT DOCUMENTS
KR 1020010109144 12/2001

OTHER PUBLICATIONS
KIPO Office Action dated Dec. 26, 2012 from corresponding application No. 10-2011-0033081.

* cited by examiner

*Primary Examiner* — Georgia Y Epps
*Assistant Examiner* — Don Williams
(74) *Attorney, Agent, or Firm* — Lowe Hauptman & Ham, LLP

(57) ABSTRACT

An image sensor the image sensor comprising an absorption layer disposed on a silicon substrate, the absorption layer having at least one of SiGe or Ge, and an antireflection layer disposed directly thereon.

20 Claims, 4 Drawing Sheets

IMAGE SENSOR WITH ANTI-REFLECTION LAYER AND METHOD OF MANUFACTURING THE SAME

BACKGROUND

The disclosure relates generally to an image sensor and, more particularly, to an image sensor having enhanced absorption coefficient for improved pixel performance and a method of manufacturing the same.

Complementary metal oxide semiconductor (CMOS) image sensors are gaining in popularity over traditional charge-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras.

CMOS image sensors utilize light-sensitive CMOS circuitry to convert light energy into electrical energy and can be designed to be illuminated from a front surface or from a back surface. The light-sensitive CMOS circuitry typically comprises a photodiode formed in a silicon substrate. As the photodiode is exposed to light, an electrical charge is induced in the photodiode. The photodiode is typically coupled to a MOS switching transistor, which is used to sample the charge of the photodiode. Colors may be determined by placing filters over the light-sensitive CMOS circuitry.

The light received by pixels of the CMOS image sensor is often based on the three primary colors: red, green, and blue (R, G, B), and additional colors can be identified and/or created with various combinations and intensities (e.g., when red and green overlap they form yellow). FIG. 1 is a graph showing the relationships between the wavelengths of blue, green, and red light and their respective quantum efficiencies. Incident light with a long wavelength such as red light (wavelength of about 600 nm) has a decreased absorption coefficient. As pixel performance is dependent on the absorption characteristics of the photodiode, this decreased absorption coefficient results in decreased red signals and an imbalance in color ratio.

Furthermore, pixel sensitivity for receiving the incident light is lowered with the trend of size reduction of pixels of the CMOS image sensor and cross-talk is caused between different pixels with incident light, especially for incident light having a long wavelength, thereby degrading the overall performance of pixels of the CMOS image sensor.

Hence, what is needed is an improved image sensor that provides for increased absorption coefficient and therefore improved pixel performance, especially for light having a long wavelength.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes have not been described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
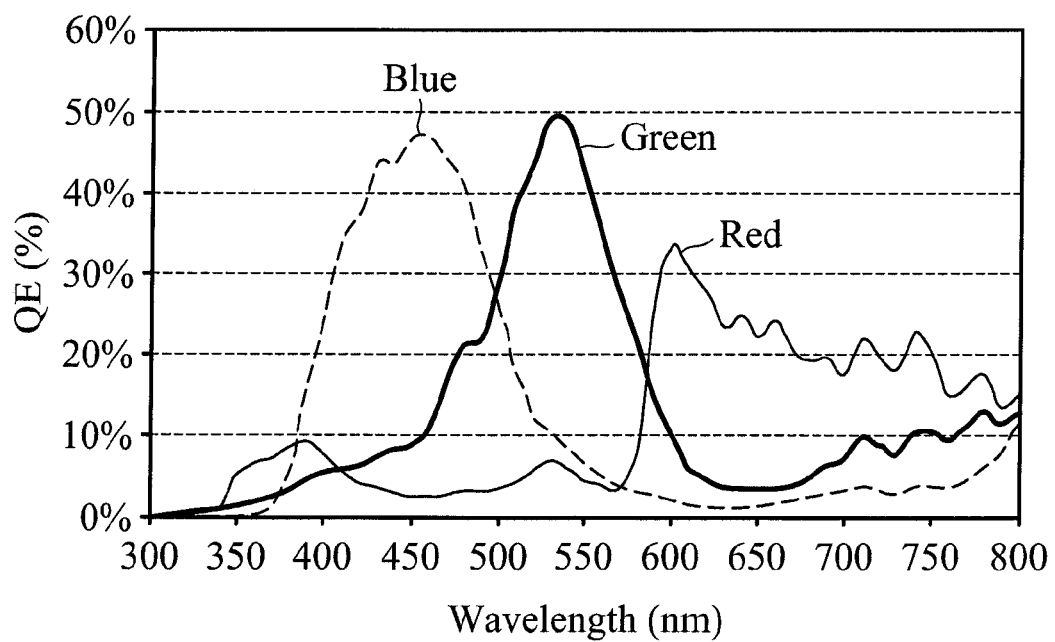
FIG. 1 is a graph showing the quantum efficiency (%) of the wavelength, λ (nm) of blue, green, and red light.
Figure 2:
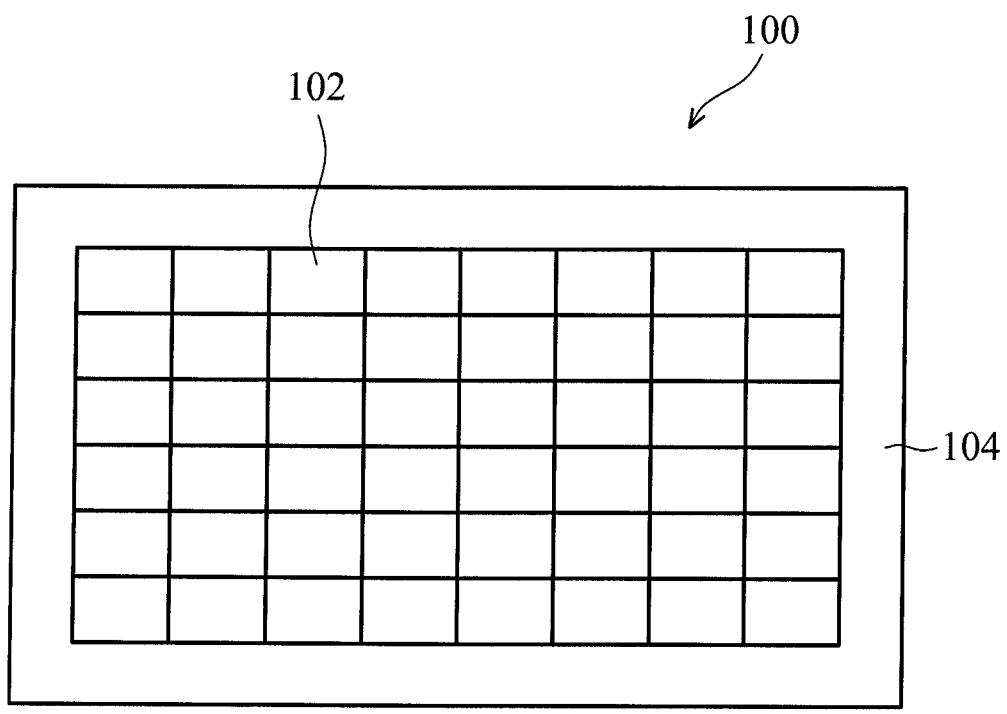
FIG. 2 illustrates an image pixel array region and surrounding logic region of an image sensor in accordance with an embodiment of the present disclosure.

With reference now to FIG. 2, there is shown an image sensor 100, which comprises a grid or array of backside illuminated pixel regions 102. Each pixel region 102 may comprise a photosensitive diode 300 (not shown in FIG. 2 but illustrated in FIG. 3), which generates a signal related to the intensity or brightness of light that impinges on the photosensitive diode 300.

The image sensor 100 may also comprise a logic region 104 located adjacent to the array of pixel regions 102. The logic region 104 may have additional circuitry and contacts for input and output connections to and from the array of pixel regions 102. The logic region 104 is utilized to provide an operating environment for the pixel regions 102 and to moderate communications between the array of pixel regions 102 and outside devices (not shown).

Figure 3:
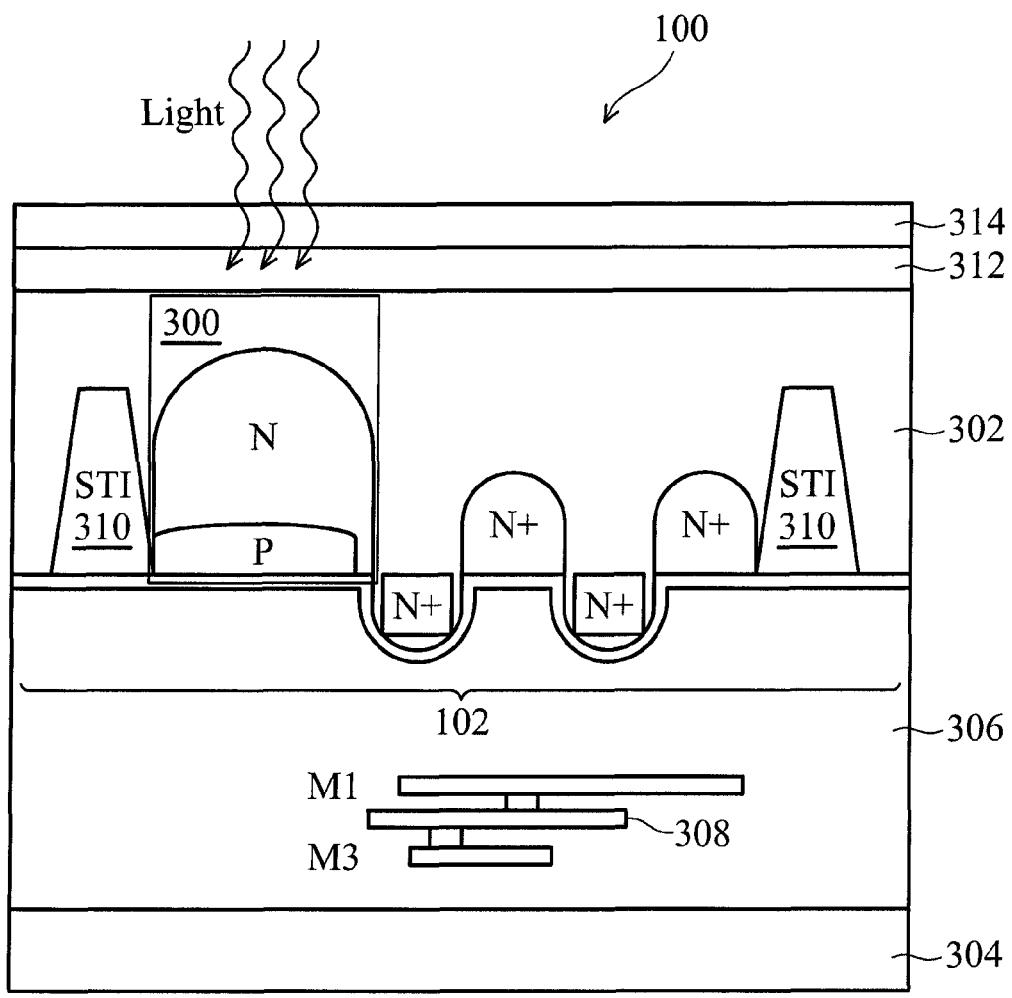
FIG. 3 is a cross-sectional view of a portion of an image sensor in accordance with an embodiment of the present disclosure.

FIG. 3 illustrates a simplified cross-sectional view of an individual pixel region 102 of image sensor 100. While pixel regions 102 and logic region 104 (FIG. 2) may be manufactured adjacent to each other, they may also be formed in separate sections of the image sensor 100. Both the pixel region 102 and the logic region 104 may be formed on a single substrate 302. The substrate 302 may be formed above a carrier wafer 304 having an insulating layer 306 therebetween. The insulating layer 306 may include a plurality of metal lines 308 for communication between the pixel region 102, logic region 104, and/or other devices. The insulation layer 306 may comprise of inter-level dielectric and/or inter-metal dielectric layers.

The substrate 302 may have a thickness between about 0.1 μm and 10 μm and may be a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may comprise a silicon-on-insulator (SOI) substrate. The substrate 302 may be doped with a p-type dopant, such as boron, aluminum, gallium, or the like, although the substrate 302 may alternatively be doped with an n-type dopant, as is known in the art.

The substrate 302 additionally comprises a plurality of isolation structures 310 designed to separate and isolate various devices formed on or in the substrate 302, and also to separate the pixel region 102 from the logic region 104. The isolation structures 310 may be shallow trench isolations generally formed by etching the substrate 302 to form a trench and filling the trench with dielectric material as is known in the art. Also formed in the substrate 302 within the pixel region 102 are transistors, source/drain regions, gate structures, metal layers, and/or passivation layers, the details of which are not described so as not to obscure embodiments of the present disclosure. In an embodiment in which the substrate 302 is a p-type substrate, the source/drain region may be formed by implanting appropriate n-type dopants such as phosphorous, arsenic, antimony, or the like. It should be noted that one of ordinary skill in the art will realize that all suitable transistors, source/drain regions, gate structures, metal layers, passivation layers, and/or configurations and their processes and steps that may be utilized in an image sensor are fully intended to be included within the scope of the present disclosure.

The pixel region 102 may comprise a photosensitive diode 300 that senses the amount of light that impinges the photosensitive diode 300 from a backside of the substrate 302, and may include a pinned layer photodiode. As one skilled in the art will recognize other photosensitive diodes may also be used. For example, a non-pinned layer photodiode may alternatively be used. Any suitable photodiode may be utilized with the present disclosure, and all of these photodiodes are intended to be included within the scope of the present disclosure.

Figure 4:
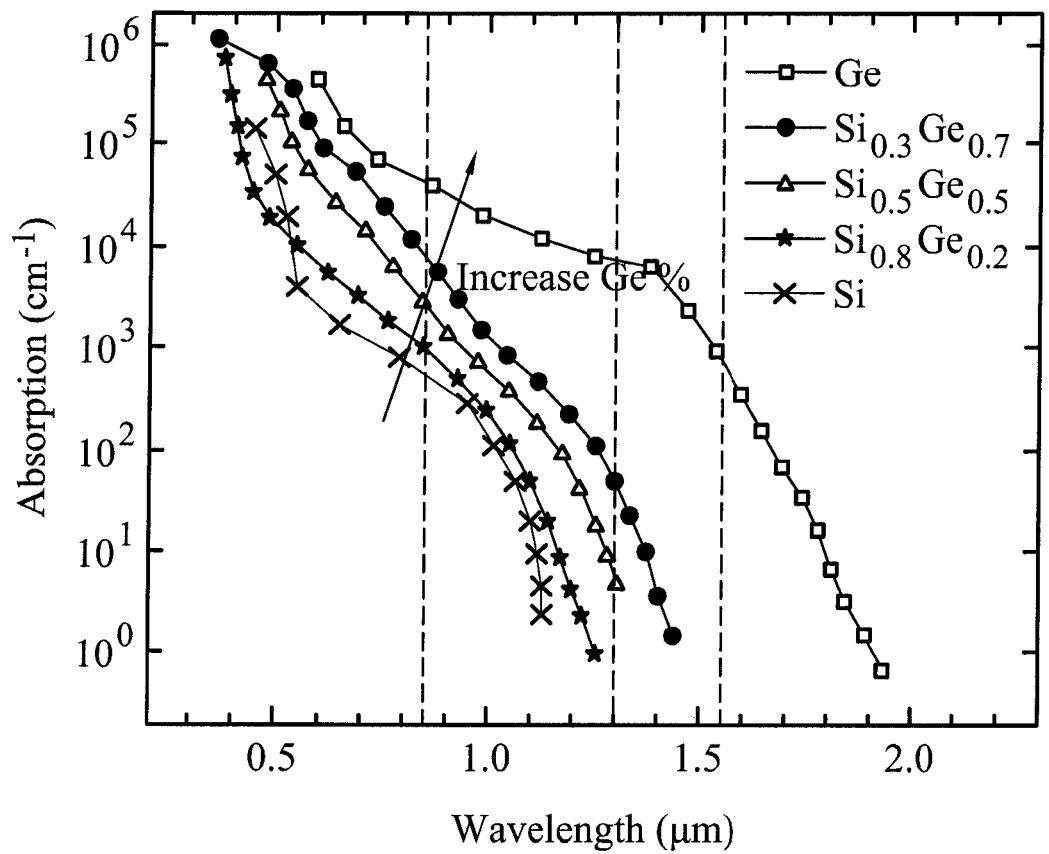
FIG. 4 is a graph showing the relationships of the light absorption coefficient ($cm^{-1}$) of a SiGe layer having various Ge content at different wavelengths (μm).

Formed above the substrate 302 is a layer of a semiconductor material, silicon germanium (SiGe) layer 312. Having a lower energy bandgap, the SiGe layer 312 enhances the image sensors incident light absorption capability and improves the image sensor's quantum efficiency, especially for longer wavelengths of light, such as red light. SiGe layer 312 may comprise from about 0.1% Ge to about 100% Ge. FIG. 4 is a graph showing the relationships of the light absorption coefficient ($cm^{-1}$) of SiGe layer with various Ge content at various wavelengths (μm) by S. J. Koester et al., "IEEE J. of Quantum Electronics," vol. 12, No. 16, p. 1489, 2006. Note an increase in the absorption coefficient of light where there is an increase of the Ge content.

SiGe layer 312 may have a thickness from about 5 angstroms to about 5,000 angstroms and may be selectively grown on the substrate 302 of the image sensor using an epitaxial chemical vapor deposition (CVD) method in-situ. In one embodiment, the epitaxial layer 312 may have a thickness from about 0.5 nm and about 500 nm. In some embodiments, epitaxial layer 312 may have a thickness from about 1 nm to about 100 nm. Ge concentrations in the SiGe layer 312 should be determined based on the thermal budget of the manufacturing process, and in one embodiment the Ge concentration is from about 0.1% to about 100% for a temperature from about 500° C. to about 1,000° C. If the fabrication process will reach temperatures of up to 1,000° C., Ge concentration in the SiGe layer 312 should be kept between 10% and 40%. If the process temperature will remain below 500° C., pure Ge can be used instead.

In addition to epitaxial growth, SiGe layer 312 may also be formed on silicon substrate 302 by implanting Ge species into silicon substrate 302. According to one embodiment of the present disclosure, the Ge implant is performed at room temperature, in a vacuum pressure chamber with a pressure from about $10^{-8}$ torr to about $10^{-7}$ torr, and for a process time from about 10 minutes to 180 minutes. The higher the Ge dosage desired, the longer the process time required. However, it is not easy to obtain Ge content in the SiGe layer 312 to be higher than about 10% using a Ge implant process. To form the SiGe layer 312 with a higher Ge content for better light absorption capability, in some embodiments it is preferable to fabricate the SiGe layer 312 using the epitaxial method as high Ge content of over 10%, such as 20%, 50%, or even up to 100% may be obtained. Other methods as are known to those skilled in the art may also be used.

After growing the SiGe layer 312, the image sensor 100 may pass through a furnace or rapid thermal anneal (RTA) process. The furnace annealing process is performed in an atmosphere of nitrogen ($N_2$), Hydrogen ($H_2$) or a combination of $N_2$ and $H_2$.

To prevent incoming photons from reflecting off the surface of the photodiode 300, and thereby failing to register a charge, an anti-reflection layer 314 may be formed above the SiGe layer 312. Anti-reflection layer 314 may comprise silicon nitride (SiN).

Although the present disclosure and its advantages have been described in detail, it should be understood that various changes, substitutions and alterations can be made herein without departing from the spirit and scope of the disclosure as defined by the appended claims. For example, charge coupled devices (CCDs) may be utilized in place of the CMOS devices within the image sensor, different materials may be utilized for the photodiode, or different methods of formation may be utilized for the various layers and devices. These devices, steps, and materials may be varied while remaining within the scope of the present disclosure.

What is claimed is:

1. An image sensor, comprising:
    an absorption layer formed on a substrate, the absorption layer comprising at least one of SiGe or Ge; and
    an anti-reflection layer disposed directly on the absorption layer.

2. The image sensor of claim 1, wherein the substrate comprises silicon.

3. The image sensor of claim 1, wherein the substrate has a thickness between about 0.1 μm and 10 μm.

4. The image sensor of claim 1, wherein the absorption layer is grown using an epitaxial chemical vapor deposition process.

5. The image sensor of claim 1, wherein the absorption layer is formed using a Ge implant process, whereby Ge implant is performed at room temperature, in a vacuum pressure chamber undergoing a pressure from about $10^{-8}$ torr to about $10^{-7}$ torr, and for a process time from about 10 minutes to 180 minutes.

6. The image sensor of claim 1, wherein the absorption layer has a thickness between about 0.5 nm and about 500 nm.

7. The image sensor of claim 1, wherein the absorption layer has a Ge concentration from about 0.1% to about 100% and is grown at a temperature from about 500° C. to about 1,000° C.

8. The image sensor of claim 1, wherein the anti-reflection layer comprises silicon nitride (SiN).

9. A backside illuminated image sensor, comprising:
    a layer formed on a silicon substrate, the layer comprising at least one of SiGe or Ge, the layer for enhancing an incident light absorption capability and improving a quantum efficiency of the image sensor; and
    an anti-reflection layer disposed directly on the layer.

10. The image sensor of claim 9, wherein the silicon substrate has a thickness between about 0.1 μm and 10 μm.

11. The image sensor of claim 9, wherein the layer is formed using an epitaxial chemical vapor deposition process.

12. The image sensor of claim 9, wherein the layer is formed using a Ge implant process, whereby Ge implant is performed at room temperature, in a vacuum pressure chamber undergoing a pressure from about $10^{-8}$ torr to about $10^{-7}$ torr, and for a process time from about 10 minutes to 180 minutes.

13. The image sensor of claim 9, wherein the layer has a thickness between about 5 angstroms and about 5,000 angstroms.

14. The image sensor of claim 9, wherein the layer has a Ge concentration from about 0.1% to about 100% and is grown at a temperature from about 500° C. to about 1,000° C.

15. The image sensor of claim 9, wherein the anti-reflection layer comprises silicon nitride (SiN).

16. A method of forming an image sensor, comprising:
    forming an absorption layer on a silicon substrate, the absorption layer comprising at least one of SiGe or Ge; and
    forming an anti-reflection layer directly on the absorption layer.

17. The method of claim 16, wherein the absorption layer is formed using an epitaxial chemical vapor deposition process.

18. The method of claim 16, wherein the absorption layer is formed using a Ge implant process.

19. The method of claim 16, wherein the absorption layer has a thickness between about 5 angstroms and about 5,000 angstroms.

20. The method of claim 16, wherein the absorption layer has a Ge concentration from about 0.1% to about 100% and is formed at a temperature from about 500° C. to about 1,000° C.

* * * * *